United States Patent
Rajwade et al.

(10) Patent No.: US 12,243,590 B2
(45) Date of Patent: Mar. 4, 2025

(54) METHOD AND APPARATUS FOR IMPROVING WRITE UNIFORMITY IN A MEMORY DEVICE

(71) Applicant: Intel Corporation, Santa Clara, CA (US)

(72) Inventors: Shantanu R. Rajwade, San Mateo, CA (US); Christian Mion, Cupertino, CA (US); Pranav Kalavade, San Jose, CA (US); Rohit S. Shenoy, Fremont, CA (US); Xin Sun, Fremont, CA (US); Kristopher Gaewsky, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 418 days.

(21) Appl. No.: 17/528,892

(22) Filed: Nov. 17, 2021

(65) Prior Publication Data

US 2023/0154539 A1  May 18, 2023

(51) Int. Cl.
| | |
|---|---|
| *G06F 3/06* | (2006.01) |
| *G11C 16/04* | (2006.01) |
| *G11C 16/10* | (2006.01) |
| *G11C 16/26* | (2006.01) |
| *G11C 16/34* | (2006.01) |
| *G11C 11/56* | (2006.01) |

(52) U.S. Cl.
CPC .............. *G11C 16/10* (2013.01); *G06F 3/061* (2013.01); *G06F 3/0659* (2013.01); *G06F 3/0679* (2013.01); *G11C 16/0483* (2013.01); *G11C 16/26* (2013.01); *G11C 16/3459* (2013.01); *G11C 11/56* (2013.01)

(58) Field of Classification Search
CPC ...... G06F 3/061; G06F 3/0659; G06F 3/0679; G11C 11/56; G11C 11/5628; G11C 16/0483; G11C 16/08; G11C 16/10; G11C 16/26; G11C 16/32; G11C 16/3459
See application file for complete search history.

(56) References Cited

U.S. PATENT DOCUMENTS

| | | | | |
|---|---|---|---|---|
| 9,348,741 | B1* | 5/2016 | Syu ..................... | G06F 12/0871 |
| 9,703,494 | B1* | 7/2017 | Rajwade ............ | G11C 16/0483 |
| 2015/0309742 | A1* | 10/2015 | Amidi ....................... | G06F 9/30 |
| | | | | 714/773 |
| 2019/0102097 | A1* | 4/2019 | Madraswala .......... | G11C 16/26 |

* cited by examiner

*Primary Examiner* — Larry T Mackall
(74) *Attorney, Agent, or Firm* — Alliance IP, LLC

(57) ABSTRACT

In one embodiment, an apparatus comprises a memory comprising a group of memory cells coupled to a wordline; and a controller configured to skip programming of one or more pages of the group of memory cells responsive to a sequential write operation; and program the one or more pages of the group of memory cells responsive to one or more random write commands.

20 Claims, 8 Drawing Sheets

METHOD AND APPARATUS FOR IMPROVING WRITE UNIFORMITY IN A MEMORY DEVICE

FIELD

The present disclosure relates in general to the field of computer development, and more specifically, to improving write uniformity.

BACKGROUND

A computer system may include one or more central processing units (CPUs) that may be coupled to one or more storage devices. A CPU may include a processor to execute software that utilizes the storage devices coupled to the CPU. The software may write data to the storage devices and read data from the storage devices. The data may be stored by the storage devices in a plurality of memory cells (e.g., NAND flash memory cells) of the storage devices.

BRIEF DESCRIPTION OF THE DRAWINGS

Like reference numbers and designations in the various drawings indicate like elements.

DETAILED DESCRIPTION

The concepts of various embodiments are applicable to memory devices used in any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
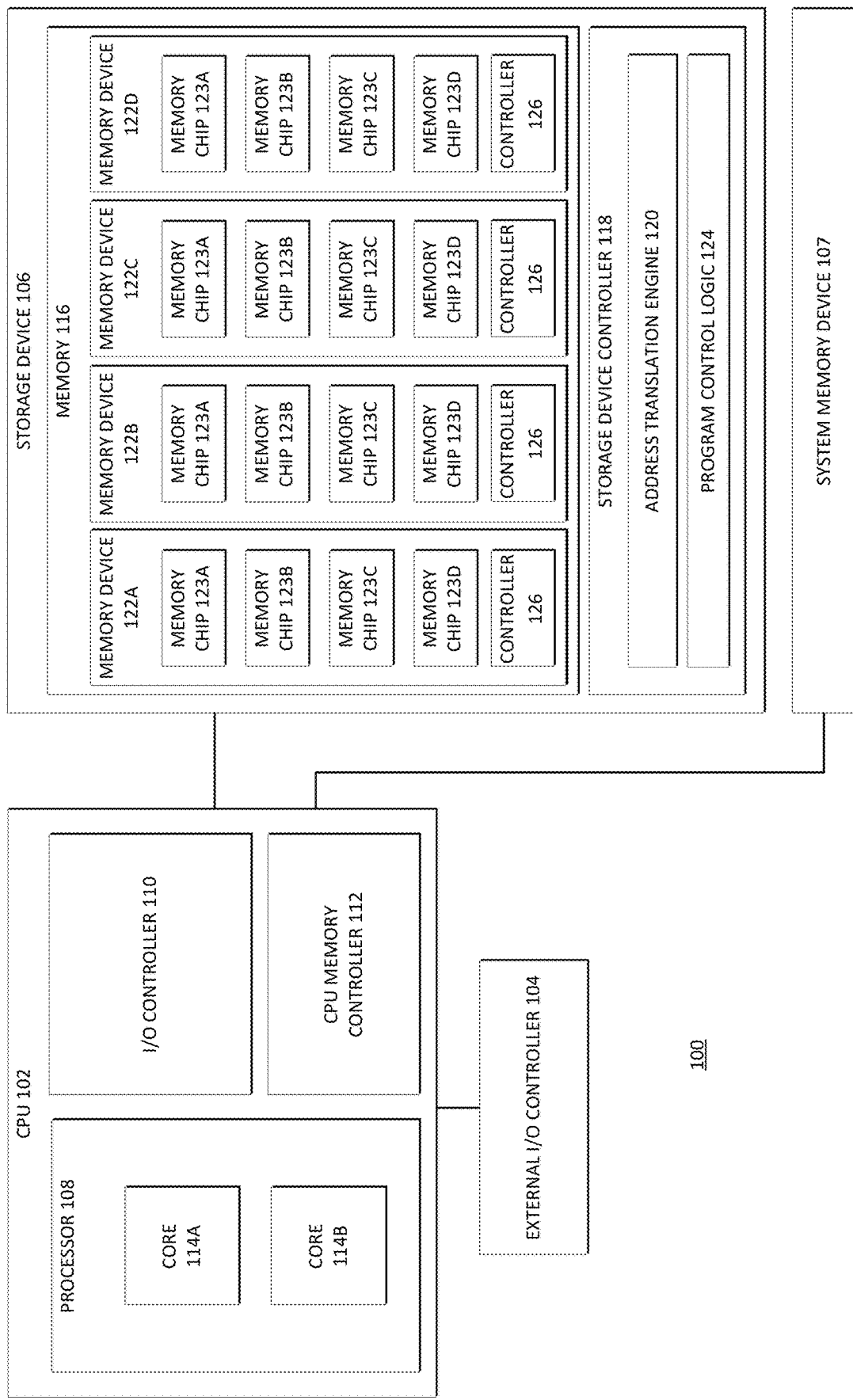
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, storage device 106, and system memory device 107. During operation, data may be transferred between storage device 106 or system memory device 107 and the CPU 102. In various embodiments, particular data operations (e.g., erase, program, and read operations) involving a storage device 106 or system memory device 107 may be managed by an operating system or other software application executed by processor 108.

A program time (TPROG) may refer to the amount of time required to program at least a portion of a wordline (e.g., the cells of the wordline in a given subblock) of the storage device 106 with a page of data. TPROG uniformity (also referred to as write uniformity) may be defined as the ratio of minimum to average throughput (MB/s) calculated in a running timer interval of 1 second and is an important metric in a sequential write operation. Write uniformity is often dictated by process integration challenges and limitations (e.g., in 3D NAND). As an example, certain groups of WLs at the edge of a deck may store pages with relatively slow TPROG due to provisioning for tighter threshold voltage distribution required to mitigate higher interference or cross temperature degradation effects. During the programming of these pages, the storage drive throughput drops (due to slower TPROG on these pages) and thus impacts write uniformity.

Write uniformity degradation for sequential write workloads may be mitigated by slowing the write bandwidth when programming faster TPROG pages to balance out the slower TPROG pages. However, this compensation method may significantly reduce the average sequential throughput (e.g., by ~10%). Various embodiments of the present disclosure may avoid a significant average sequential throughput loss by improving uniformity by utilizing extra storage device density that may be underutilized in sequential write workloads. Physical density in various storage devices may be, e.g., 10-30% higher than the logical density. For example, a 1 TB SSD may actually have physical capacity ranging from 1.1-1.3 TB. The overprovisioning of density is generally done to reduce the write-amplification factor (WAF) in random write workloads. As an example, a WAF=3 means that every 1 KB of data sent to the storage device 106 (e.g., by CPU 102) results in 3 KB written by the storage device 106. However, pure sequential write workloads have a WAF=1. In such scenarios, the overprovisioned density may remain underutilized.

Various embodiments of the present disclosure improve storage device write uniformity by utilizing overprovisioned density to skip programming of certain (e.g., pre-determined) pages that have high TPROGs (and thus are slow to program). While skipping certain pages during programming of data of sequential write workloads may reduce the overall density of the storage device, the density reduction is relatively small (e.g., ~1-2%) and is only applicable to sequential write operations (as opposed to random write operations) and can easily be absorbed in the intrinsic overprovisioning designed into a storage device (e.g., ~10-30%) utilized to maintain reasonable write-amplification factor (WAF) in random write scenarios. In some embodiments, write uniformity may be improved by >10% at the cost of ~1% loss in density for sequential write workloads.

In various embodiments, a storage device 106 comprises NAND flash memory (herein a storage device comprising NAND flash memory is referred to as a NAND flash storage device). In some embodiments, storage device 106 may be a solid-state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, a quad-level cell (QLC) memory has cells that each store four bits of data, and a penta-level cell (PLC) memory has cells that each store five bits of data, though some memories may utilize multiple encoding schemes (e.g., MLC and TLC) on the same array or on different arrays of the same device.

A storage device 106 may include any number of memories 116 and each memory 116 may include any number of memory devices 122 (e.g., 122A-D). In a particular embodiment, a memory device 122 may be or comprise a semiconductor package with one or more memory chips 123 (e.g., memory chips 123A-D). In the embodiment depicted, memory 116 includes memory devices 122A-D (while specific references herein may be made to memory device 122A, the other memory devices may have any suitable characteristics of memory device 122A) and memory device controller 126.

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 that may be coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that remains stored even after power to the system memory device 107 is removed. A system memory device 107 may be dedicated to a particular CPU 102 or shared with other devices (e.g., one or more other processors or other devices) of computer system 100.

In various embodiments, a system memory device 107 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random-access memory (DRAM) or static random-access memory (SRAM). One particular type of DRAM that may be used in a memory array is synchronous dynamic random-access memory (SDRAM). In some embodiments, any portion of system memory device 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and a memory 116 comprising four memory devices 122A-D operable to store data, however, a storage device may include any suitable number of memory devices. A memory device 122A includes a plurality of memory cells that are each operable to store one or more bits. The cells of a memory device 122A may be arranged in any suitable fashion, such as in rows (e.g., wordlines) and columns (e.g., bitlines), three dimensional structures, and/or other manner. In various embodiments, the cells may be logically grouped into banks, blocks, sub-blocks, planes, wordlines, pages, frames, bytes, or other suitable groups. In various embodiments, a memory device 122A comprises one or more NAND flash memory arrays.

A memory device 122A may include any of the volatile or non-volatile memories listed above or other suitable memory. In particular embodiments, memory device 122A includes non-volatile memory, such as planar or 3D NAND flash memory. In particular embodiments, a memory device 122A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 106 comprising NAND flash memory may receive a command that has a format compliant with a DDR-based standard and may translate the command into one or more commands that are compatible with NAND flash memory of the storage device 106. Similarly, the storage device 106 may format results from operations performed on the NAND flash memory into a format that is compliant with a DDR-based standard before transmitting the results to the CPU 102.

In a particular embodiment, a memory device 122 is a semiconductor package. In various embodiments, a semiconductor package may comprise a casing comprising one or more semiconductor dies (also referred to as chips) (e.g., memory chips 123A-D). A package may also comprise contact pins or leads used to connect to external circuits. However, a package is merely one example form a memory device 122 may take as a memory device may be any suitable arrangement of one or more memory arrays and associated logic in any suitable physical arrangement. For example, although a single physical package may include a single memory device 122, multiple memory devices 122 could be resident on a single package or a memory 122 could be spread across multiple packages.

A memory 116 may be embodied in one or more different physical mediums, such as a circuit board, die, disk drive, other medium, or any combination thereof (or combination with one or more packages). In a particular embodiment, memory 116 comprises a circuit board coupled to a plurality of memory devices 122 that each comprise a semiconductor package.

Storage device 106 may comprise any suitable type of memory and is not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices. Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to a memory 116 (or memory devices(s) and/or memory chip(s) thereof), and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same circuit board or device as a memory 116 or on a different circuit board, or device. For example, in some environments, storage device controller 118 may be a centralized storage controller that manages memory operations for multiple different memories 116 (which may each be of the same type of memory or may be of different types) of computer system 100 (and thus may provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a host computing device coupled to the storage device 106) and the physical address space of the memory 116 of the storage device 106 (which may or may not be exposed to the host computing device). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within a memory array of a memory 116) of the storage device 106, such as an identifier of the memory 116 on which the physical memory location is located, an identifier of the memory device 122A on which the physical memory location is located, one or more pages of the physical memory location, one or more subblocks of the physical memory location, one or more wordlines of the physical memory location, one or more bitlines of the physical memory location, or other suitable identifiers or encodings thereof.

In various embodiments, the storage device 106 also includes program control logic 124 which alone or in combination with a memory device controller 126 is operable to control the programming sequence performed when data is written to a memory 116, the read sequence performed when data is read from a memory 116, or an erase sequence when data is erased from a memory 116. In various embodiments, program control logic 124 may provide the various voltages (or information indicating which voltages should be provided) that are applied to one or more memory cells, wordlines, bitlines, and/or other portions of a memory array during the programming, reading, and/or erasing of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory 116 and/or memory devices 122A-D.

In some embodiments, all, or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a host computing device (e.g., CPU 102) may be located on the same circuit board or on the same device and in other embodiments the storage device 106 and the host computing device may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a host computing device (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
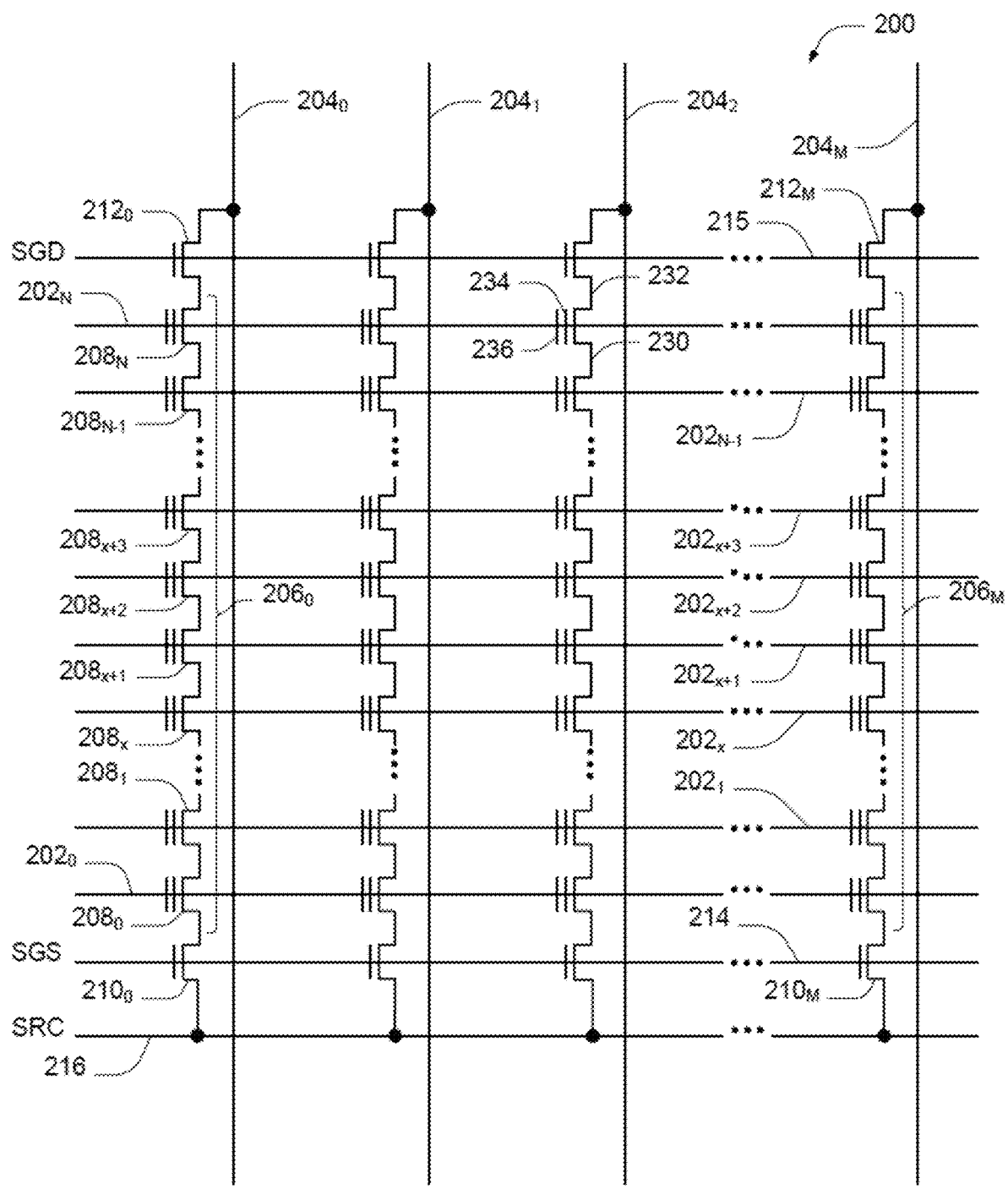
FIG. 2 illustrates an example portion of a NAND flash memory array in accordance with certain embodiments.

FIG. 2 illustrates an example portion of a NAND flash memory array 200 in accordance with certain embodiments. In various embodiments, memory device 122A includes an array 200 of memory cells logically arranged in rows and columns. Memory cells of a logical row are typically connected to the same access line (commonly referred to as a word line) while memory cells of a logical column are typically selectively connected to the same data line (commonly referred to as a bit line). In some embodiments, a single access line may be associated with more than one logical row of memory cells and a single data line may be associated with more than one logical column. Memory cells of the array are capable of being programmed to one of at least two data states (e.g., program levels).

Memory array 200 includes access lines, such as word lines $202_0$ to $202_N$, and data lines, such as bit lines $204_0$ to $204_M$. In some embodiments, the word lines 202 may be connected to global access lines (e.g., global word lines) in a many-to-one relationship.

Memory array 200 may be arranged in rows (each corresponding to a word line 202) and columns (each corresponding to a bit line 204). Each column may include a string of series-connected memory cells, such as one of NAND strings $206_0$ to $206_M$. Each NAND string 206 may be connected (e.g., selectively connected) to a common source 216 and may include a plurality of memory cells. For example, NAND string $206_0$ includes memory cells $208_0$ to $208_N$. The memory cells 208 represent non-volatile memory cells for storage of data. The memory cells 208 of each NAND string 206 may be connected in series between a select transistor 210 (e.g., a field-effect transistor), such as one of the select transistors $210_0$ to $210_M$ (e.g., that may each be a source select transistor, commonly referred to as select gate source), and a select transistor 212 (e.g., a field-effect transistor), such as one of the select transistors $212_0$ to $212_M$ (e.g., that may each be a drain select transistor, commonly referred to as select gate drain). Select transistors $210_0$ to $210_M$ may be commonly connected to a select line 214, such as a source select line, and select transistors $212_0$ to $212_M$ may be commonly connected to a select line 215, such as a drain select line. In a particular embodiment, a drain select line may be coupled to the drain select transistors of an entire subblock (and each subblock may have its own drain select line) while a source select line may be coupled to the source select transistors of an entire block (and each block may have its own source select line).

A source of each select transistor 210 may be connected to common source 216. The drain of each select transistor 210 may be connected to a memory cell $208_0$ of the corresponding NAND string 206. For example, the drain of select transistor $210_0$ may be connected to memory cell $208_0$ of the corresponding NAND string $206_0$. Therefore, each select transistor 210 may be configured to selectively couple a corresponding NAND string 206 to common source 216. A control gate of each select transistor 210 may be connected to select line 214.

The drain of each select transistor 212 may be connected to the bit line 204 for the corresponding NAND string 206. For example, the drain of select transistor $212_0$ may be connected to the bit line $204_0$ for the corresponding NAND string $206_0$. The source of each select transistor 212 may be connected to a memory cell of the corresponding NAND string 206. For example, the source of select transistor $212_0$ may be connected to memory cell $208_N$ of the corresponding NAND string $206_0$. Therefore, each select transistor 212 may be configured to selectively connect a corresponding NAND string 206 to a corresponding bit line 204. A control gate of each select transistor 212 may be connected to select line 215.

The memory array in FIG. 2 may be a quasi-two-dimensional memory array and may have a generally planar structure, e.g., where the common source 216, NAND strings 206 and bit lines 204 extend in substantially parallel planes. Alternatively, the memory array in FIG. 2 may be a three-dimensional memory array, e.g., where NAND strings 206 may extend substantially perpendicular to a plane containing the common source 216 and to a plane containing the bit lines 204 (that may be substantially parallel to the plane containing the common source 216).

Typical construction of memory cells 208 includes a data-storage structure 234 (e.g., a floating gate, charge trap, etc.) that maintains a data state of the cell (e.g., through changes in threshold voltage), and a control gate 236. In some cases, memory cells 208 may further have a defined source 230 and a defined drain 232. Memory cells 208 have their control gates 236 connected to (and in some cases form) a word line 202.

A column of the memory cells 208 is one or more NAND strings 206 selectively connected to a given bit line 204. A row of the memory cells 208 are memory cells commonly connected to a given word line 202. A row of memory cells 208 may but need not include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line 202N and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2, it is apparent from the figure that the bit lines 204 of the array of memory cells 200 may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line may be deemed a physical page. For particular memory devices, all memory cells of a particular subblock commonly connected to a given word line may be deemed a physical page. For example, memory cells that are coupled to a particular wordline in a subblock may comprise a first physical page, memory cells that are coupled to the particular wordline in a second subblock may comprise a second physical page, and so on. A bit from each memory cell of a physical page may be deemed a logical page. Thus, a single physical page may store multiple logical pages (e.g., a TLC scheme may store three logical pages in a single physical page).

In sensing (e.g., reading) a data state of a selected (e.g., target) memory cell, the memory cell is selectively activated in response to a particular voltage level applied to its control gate while current paths from the memory cell to the data line and to the source are established, thus permitting current flow, or lack thereof, between the data line and the source to indicate whether the memory cell has been activated in response to the particular voltage level applied to its control gate. For example, for a sensing operation of selected memory cell $208_{x+1}$ of NAND string $206_0$, a sense voltage (e.g., a read voltage or a verify voltage) may be applied to the control gate of memory cell $208_{x+1}$ while voltage levels are applied to the control gates of memory cells $208_0$ to $208_x$ and $208_{x+2}$ to $208_N$ of NAND string $206_0$ sufficient to activate those memory cells regardless of their data states, and while voltage levels are applied to the control gates of select transistors $210_0$ and $212_0$ sufficient to activate those transistors. A sense operation that determines whether the memory cell $208_{x+1}$ is activated in response to one or sense voltages may indicate one or more bits of the data state stored in that memory cell. In various embodiments, each memory cell 208 can be programmed according to an SLC, MLC, TLC, a QLC, or other encoding scheme. Each cell's threshold voltage (Vt) is indicative of the data that is stored in the cell.

Although various embodiments have been described with respect to a particular type of memory array (e.g., a NAND flash memory array), the teachings of the various embodiments may be equally applicable to any type of memory arrays (e.g., AND arrays, NOR arrays, etc.), including those recited herein or similar memory arrays.

Figure 3:
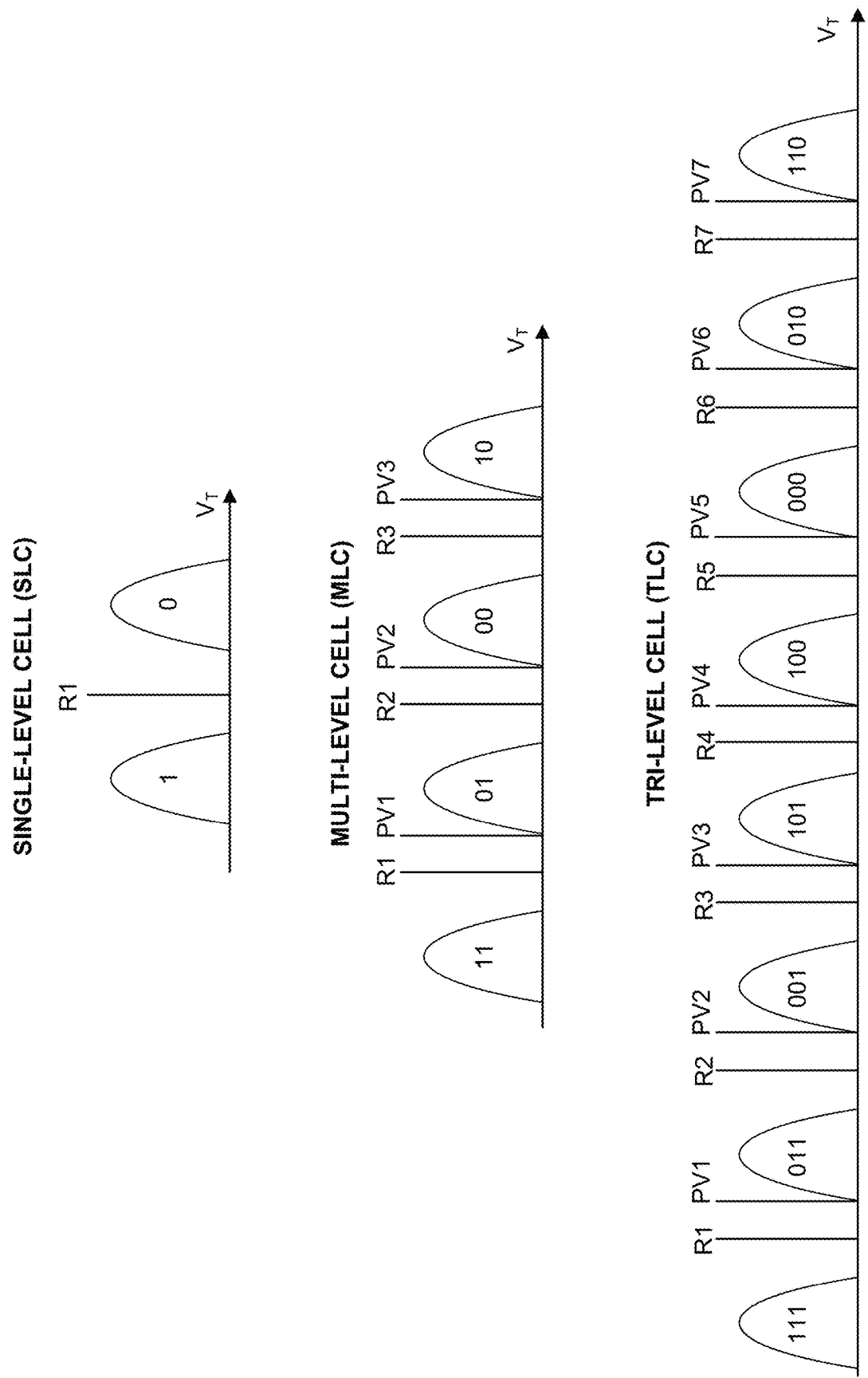
FIG. 3 illustrates example encodings of bits within NAND flash memory cells in accordance with certain embodiments.

FIG. 3 illustrates example encodings of bits within NAND flash memory cells 208 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted elliptical regions. In other words, a program level may correspond to one of the bit encodings used in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, and the QLC scheme has fifteen program levels. When data (e.g., one or more pages) is written to memory 116, a plurality of the cells may be programmed to a first program level, a plurality of the cells may be programmed to a second program level, and so on.

The various R voltage values depicted in FIG. 3 (e.g., R1, R2, R3, . . . ) represent read voltages that may be applied to a wordline when the values of cells coupled to that wordline are being read. When a particular read voltage is applied, sense circuitry may determine whether the threshold value of a cell is greater than or less than the read voltage based on a voltage or current sensed by the sense circuitry via the bitline of the cell. Although not shown in FIG. 3, a QLC encoding scheme may utilize a similar scheme where fifteen read voltages may be used to resolve the values of four bits within each cell, where R1<R2<R3< . . . <R15.

The various program verify voltages (PV1-PV3 in the MLC encoding scheme and PV1-PV7 in the TLC encoding scheme) depicted represent program verify voltages that may be applied to a cell during programming of the cell (e.g., during a program verify operation) to determine whether the threshold voltage of the cell has reached its desired level. For example, in the MLC encoding scheme, if the cell is to be programmed to "01" (i.e., program level 1), then PV1 may be applied to the cell during a verify procedure and if sensing circuitry determines that the threshold voltage of the cell is greater than PV1, then the cell is considered to have passed programming. If the threshold voltage of the cell is less than PV1, the cell is considered to not have passed programming and the storage device 106 may attempt to raise the threshold voltage of the cell or may allow the cell to fail and may later attempt error correction on the cell. As another example, if the cell is to be programmed to "00" (i.e., program level 2), then PV2 may be applied to the cell during a verify procedure and if sensing circuitry determines that the threshold voltage of the cell is greater than PV2, then the cell is considered to have passed programming. Similarly, if the cell is to be programmed to "10" (i.e., program level 3), then PV3 may be applied to the cell during a verify procedure. Any suitable program verify voltages may be used for any of the encoding schemes. In particular embodiments and as depicted, the program verify voltage may be set to a value that is at or near the beginning of the corresponding threshold voltage range. In various embodiments, there may be some margin between a program verify voltage and a corresponding read level voltage to allow for slight threshold voltage droopage over time and to improve sensing accuracy. For example, the figure depicts a margin between R1 and PV1, a margin between R2 and PV2, and so on.

In particular embodiments, cells may be programmed one or more pages (e.g., logical pages) at a time, where a page is stored in a group of cells (e.g., a physical page) that are coupled to the same wordline. For example, the group of cells that is programmed may be identified by a particular wordline and a particular subblock. The group of cells may store one page of data (if the cells are encoded according to an SLC scheme) or multiple pages of data (if the cells are encoded according to an MLC, TLC, QLC, or other multi-level encoding scheme).

In various embodiments, a cell that is encoded to store multiple bits may form a part of multiple different pages, with each bit of the cell corresponding to a distinct page. For example, for a cell that is encoded with two bits (i.e., using an MLC encoding scheme), one bit may correspond to an Upper Page (UP) and the other bit may correspond to a Lower Page (LP). As another example, for a cell that is encoded with three bits (i.e., using a TLC encoding scheme), one bit may correspond to an LP, one bit may correspond to a UP, and the other bit may correspond to an Extra Page (XP). As yet another example, for a cell that is encoded with four bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may comprise an aggregation of corresponding bits stored by a plurality of different cells of a wordline (e.g., a physical page). For example, referring to the encoding shown in FIG. 3, all of the rightmost bits of a plurality of cells encoded using a TLC scheme may form an LP, all of the middle bits of the plurality of cells may form a UP, and all of the leftmost bits of the plurality of cells may form an XP.

A programming sequence for a group of cells may comprise programming all of the intended pages into the group of cells. A programming sequence may include one or more programming passes. A programming pass (which may comprise one or more programming loops) may encode one or more pages. A programming pass may comprise the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). In some embodiments, one or more loops of a programming pass may comprise the application of one or more effective program voltages without the application of one or more verify voltages. The application of an effective program voltage to a cell may include changing the voltage difference between a control gate and a channel of the cell in order to change the threshold voltage of the cell. Thus, the voltage of a wordline (coupled to the control gate of the target cell) and/or a channel of the cell may be set in order to effectuate application of an effective program voltage. As a "program voltage" is commonly used to refer to a voltage applied to a wordline, the term "effective program voltage" is used herein to refer to the voltage difference between a control gate and channel of a cell (which in instances where the channel is held at 0 V will be synonymous with program voltage). Reference herein to a start program voltage may refer to either a program voltage or an effective program voltage.

As mentioned above, a programming pass may program one or more pages. For example, when the cells of a wordline are encoded using an MLC scheme, both pages (the LP and the UP) may be programmed during a single programming pass by setting the voltage levels of the cells to the desired program level (e.g., within one of the four voltage ranges depicted for the MLC scheme in FIG. 3). Alternatively, an LP could be programmed in a first pass and a UP could be programmed in a second pass. For example, during the first pass, first bits of the cells (where the first bits of the cells collectively form the LP) may be programmed to a binary state based on the desired value of each bit. For example, referring to the MLC scheme depicted in FIG. 3, if the rightmost bits of the cells form the LP, and a particular rightmost bit is to be programmed to a '0' value, the Vt of the cell may be programmed to a value that is slightly greater than PV2 in the first programming pass (or at least a portion of the way to PV2 so as to be distinguished from cells that are left in a low voltage erased state). If a particular rightmost bit is to be stored as a '1' value, it may be left at a low voltage level. During the second pass, second bits of the same cells (where the second bits of the cells collectively form the UP) are programmed, resulting in the Vt of the cells being changed to their desired Vt (e.g., within one of the four voltage ranges depicted for the MLC scheme in FIG. 3), thus storing values for the UP and the LP. As other examples, when the cells of a wordline are encoded using a TLC scheme or a QLC scheme, all pages may be programmed during a single programming pass by setting the voltage levels of the cells to the desired program level, or one or more of the pages may be programmed during a first pass and the remaining pages programmed during a second pass (or the remaining pages may be programmed using multiple additional passes). For example, in a TLC scheme, a first pass may encode an LP and a second pass may encode the UP and the XP. As another example, in a QLC scheme, a first pass may encode an LP and a UP and a second pass may encode the XP and the TP or a first pass may encode the LP and a second pass may encode the UP, XP, and TP.

As used herein, "lower page(s)" may be used to refer to one or more pages that are programmed in a first programming pass and "upper page(s)" may be used to refer to one or more pages that are programmed in one or more subsequent programming passes. These designations may be distinguished from the Lower Page and Upper Page previously described (in general a Lower Page will be a lower page as used herein when multiple programming passes are used while an Upper Page may be a lower page or an upper page depending on whether it is programmed in the first programming pass or in a subsequent programming pass). Thus, in an MLC scheme, a lower page (e.g., the LP) may be programmed in a first programming pass and an upper page (e.g., the UP) may be programmed in a second programming pass (this may also be referred to as 2-4 programming, as the cells are programmed to two levels in the first pass and four levels in the second pass). As another example, in a TLC scheme, a lower page (e.g., the LP) may be programmed in a first programming pass and upper pages (e.g., the UP and the XP) may be programmed in a second programming pass (this may be referred to as 2-8 programming). As another example, in a TLC scheme, lower pages (e.g., the LP and the UP) may be programmed in a first programming pass and an upper page (e.g., the XP) may be programmed in a second programming pass (this may be referred to as 4-8 programming). As another example, in a TLC scheme, lower pages (e.g., the LP, the UP, and the XP) may be programmed coarsely in a first programming pass and the upper page (e.g., the XP) may be read out and programmed again in a more precise manner in a second programming pass (this may be referred to as 8-8 programming). As another example, in a QLC scheme, a lower page (e.g., the LP) may be programmed in a first programming pass and upper pages (e.g., the UP, XP, and TP) may be programmed in a second programming pass (this may be referred to as 2-16 programming). As another example, in a different QLC scheme, lower pages (e.g., the LP and the UP) may be programmed in a first programming pass and upper pages (e.g., the XP and the TP) may be programmed in a second programming pass (this may be referred to as 4-16 programming). As another example, in a different QLC scheme, lower pages (e.g., the LP, the UP, and the XP) may be programmed in a first programming pass and an upper page (e.g., the TP) may be programmed in a second programming pass (this may be referred to as 8-16 programming). Any other suitable permutations of pages programmed in programming passes is contemplated in this disclosure including multiple passes being used to program the upper pages.

In particular embodiments, a logical page of data (which may correspond to a page of data referred to by a computing host such as CPU 102) may correspond to an LP, UP, XP, TP, or other page of memory stored in cells that are encoded with multiple bits. Accordingly, two logical pages of data may correspond to an LP and a UP stored in a group of cells encoded using an MLC scheme, three logical pages of data may correspond to an LP, UP, and XP stored in a group of cells encoded using a TLC scheme, four logical pages of data may correspond to an LP, UP, XP, and TP stored in a group of cells encoded using a QLC scheme, and so on. Thus, when a computing host writes to storage device 106, if multiple pages are to be programmed in a single pass, multiple logical pages from the computing host may be aggregated and programmed in the pass. For example, in memory encoded using a TLC scheme, when the LP and UP are programmed in a single pass, two logical pages of data may be aggregated (where one logical page is stored in the LP and one logical page is stored in the UP).

In particular embodiments, if multiple programming passes are used to program the cells of a first wordline, one or more programming passes may be performed on one or more adjacent wordlines after an initial programming pass is performed on the first wordline and before an additional programming pass is performed on the first wordline. Such embodiments may mitigate the effects of interference caused to cells by the programming of neighboring wordlines. In other embodiments, multiple passes may be performed on the cells of a wordline before the next wordline is programmed.

A single-pulse programming (SPP) scheme may utilize a waveform with a single program pulse which is applied to cells (e.g., via a wordline of the cells) to move the threshold voltages (Vts) of all the cells that are below their destined program verify voltage (i.e., the cells that have not yet reached their targeted program level). A multi-pulse programming (MPP) scheme may apply two (or more) effective program voltages to cells during a single program loop, where each effective program voltage is applied to a group of cells targeted towards different program levels. Thus, a typical program loop in an MPP scheme may involve application of a first effective program voltage to a first group of cells, then application of a second effective program voltage to a second group of cells, then activation of additional effective program voltages to additional groups of cells (if applicable), and then application of one or more program verify voltages to determine which cells have reached their targeted voltage levels. In various embodiments, one or more of the MPP program loops may omit the application of the program verify voltages.

As described above, an effective program voltage may be used herein to refer to the channel-to-control gate voltage difference applied to one or more cells. Thus, if a channel is not boosted (but is held at 0V), the effective program voltage is equal to the program voltage applied to the wordline and if a channel is boosted, the effective program voltage is equal to the difference between the program voltage applied to the wordline and the voltage of the channel. In a single pulse programming scheme, only a single effective program voltage is applied during a program loop to cells being programmed during that loop. In various embodiments, when a single page is programmed during a first pass, an SPP scheme may be used to program the page, and when one or more additional pages are programmed in a subsequent pass an MPP scheme may be used to program the one or more additional pages.

Figure 4:
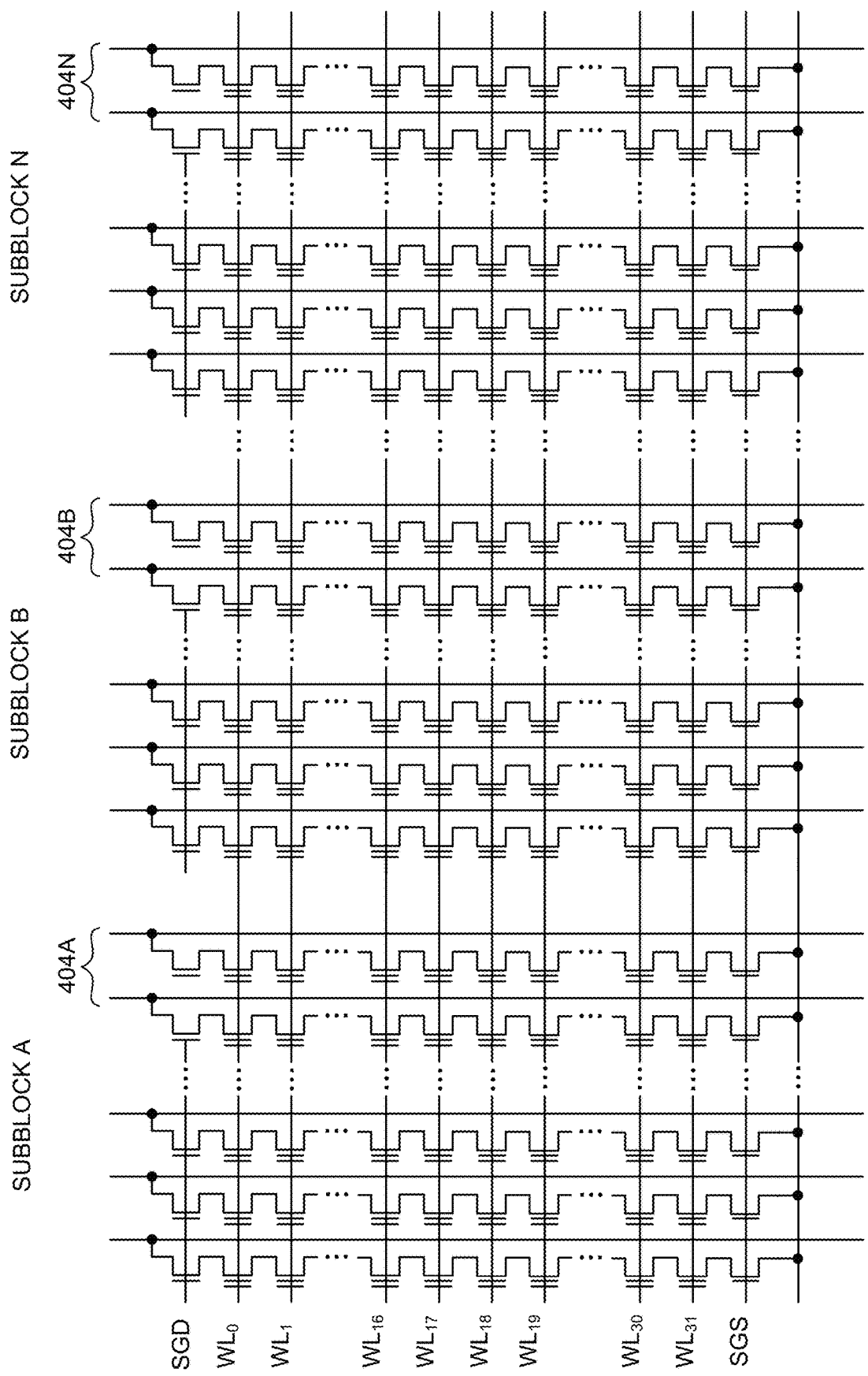
FIG. 4 illustrates example subblocks of a block of a memory device in accordance with certain embodiments.

FIG. 4 depicts memory cells of a memory array arranged into a plurality of subblocks (subblocks A-N) in accordance with certain embodiments. In a particular embodiment, memory cells of an array 200 of chip 123 may be arranged into subblocks and blocks. As an example, a subblock may comprise a number of series strings and a block may comprise a number of subblocks. In various embodiments, a source select line (controlled by source gate select signal SGS) is shared by each series string of a block and each series string of a particular subblock shares a drain select line (controlled by drain gate select signal SGD) with each subblock having its own drain select line.

In a particular embodiment, a subblock may contain a single physical page of memory for each wordline of the subblock (in other embodiments, a subblock may contain multiple physical pages of memory for each wordline). Thus, a block of memory may be divided into a large number of physical pages. As described above, a logical page may be a unit of programming or reading that contains a number of bits equal to the number of cells in a physical page. In a memory that stores one bit per cell (e.g., an SLC memory), one physical page stores one logical page of data. In a memory that stores two bits per cell (e.g., an MLC memory), a physical page stores two logical pages.

In some embodiments, during programming of a block, the memory cells coupled to a particular wordline in a first subblock may be programmed with one or more pages, then the memory cells coupled to that wordline in a second subblock may be programmed with one or more pages, and so on. Then, another wordline (e.g., an adjacent wordline) may be programmed in like manner.

In a sequential write operation, data is written to sequential logical pages by a computing host. Sequential logical pages may refer to pages with logical addresses that are sequential. For example, a first logical page having a logical address is sequential with a second logical page that has the next available logical address. Sequential data (e.g., from a file written by a computing host to storage device 106A) may be stored by writing a first page of data to a first logical page have a first logical address, a second page of data to a second logical page having the next available logical address, a third page of data to a third logical page having the next available logical address after the logical address of the second logical page, and so on. In particular embodiments, sequential data may be stored in the same group of cells using multiple pages stored by the cells. For example, using the example above, the first logical page may be stored on a LP stored using a particular bit in each of a group of cells (e.g., of the same wordline), the second logical page on a UP using a different bit in each of the group of cells, and the third logical page on an XP using yet another bit of the group of cells, when the group of cells is encoded using a TLC scheme. Similarly, memory cells encoded using an MLC scheme or a QLC scheme could include sequential data on two or more of the various pages of such memory cells.

In particular embodiments, sequential data is stored together in pages that are programmed using the same programming pass. For example, when MLC encoding is used, data written to a first logical page by a computing host may be programmed into the LP and data written to a second logical page (which is the next logical page in a sequential ordering of the logical pages) may be programmed into the UP in the same programming pass. As another example, a single pass may be used to program sequential data to an LP and UP of memory cells encoded using a TLC scheme or a QLC scheme. As another example, a single programming pass may be used to program sequential data to an LP, UP, and XP with sequential data of memory encoded using a TLC or QLC scheme. As another example, a single programming pass may be used to program sequential data to an LP, UP, and XP of memory encoded using a QLC scheme. As another example, a single programming pass may be used to program sequential data to an LP, UP, XP, and TP of memory encoded using a QLC scheme. Other embodiments may include sequential data being programmed to any combination of pages stored by a common group of cells.

Figure 5:
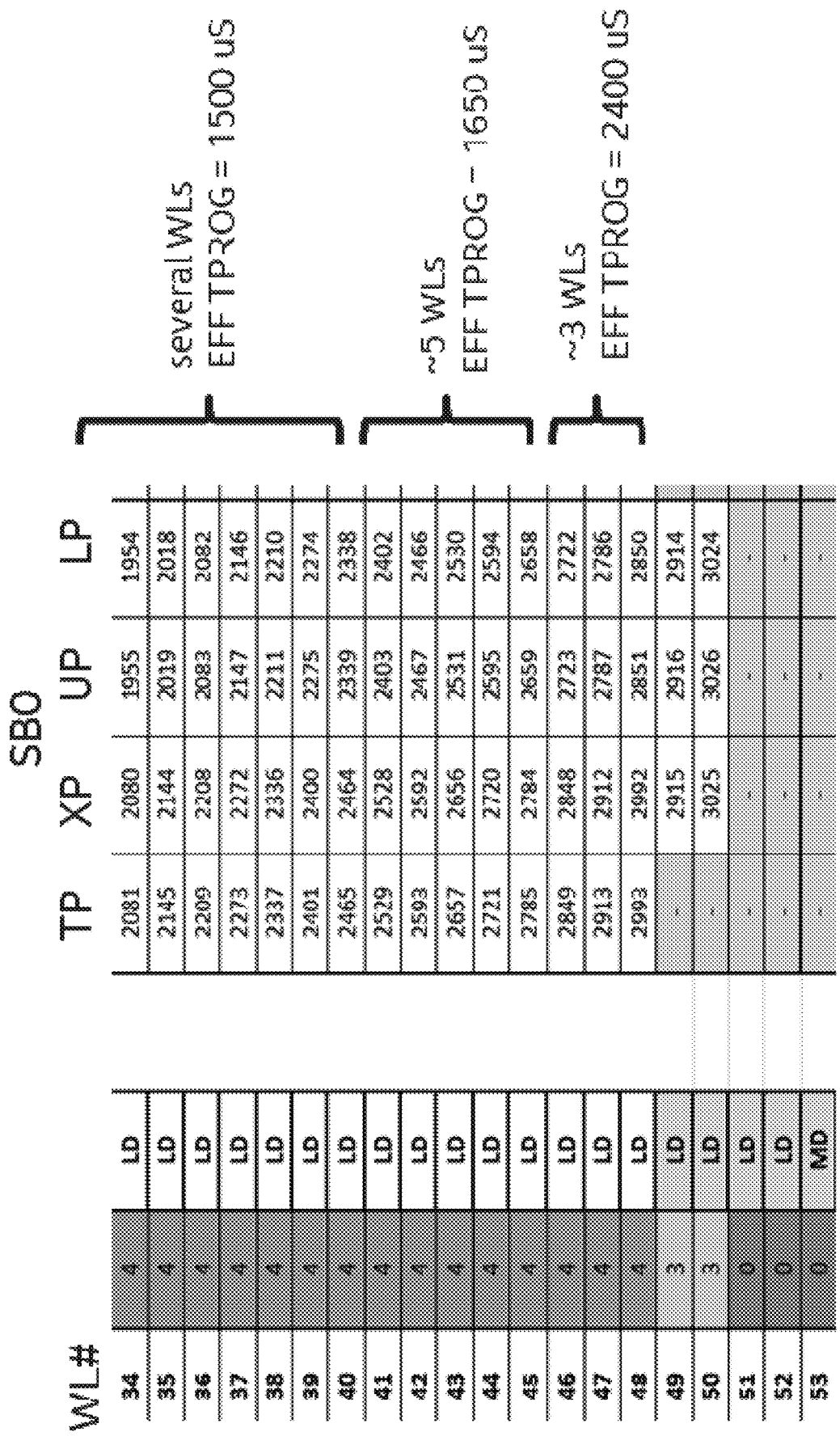
FIG. 5 illustrates effective program times for various wordlines of a subblock in accordance with certain embodiments.

FIG. 5 illustrates effective program times (EFF TPROGs) for various wordlines (WL) of a subblock (SB0) in accordance with certain embodiments. FIG. 5 depicts an example pagemap for a QLC 3D NAND memory array and TPROG dependence on WL location. In the depicted embodiment, the QLC 3D NAND memory array may comprise 48 active WLs per deck (where LD in the FIG. corresponds to a lower deck and MD corresponds to a middle deck) and any number of subblocks (SB), with only one subblock (SB0) shown for illustration purposes. The active wordlines may illustrate wordlines in which data provided by the computing host is stored. In the embodiment depicted, WLs 34-50 are active WLs, with WLs 34-48 each configured to store 4 pages of data (e.g., LP, UP, XP, TP) in SB0 and WLs 49-50 each configured to store 3 pages (e.g., LP, UP, XP) of data in SB0. WLs 51-53 are not active wordlines and thus are not configured to store data (e.g., due to unreliability). Although not shown, the other side of the lower deck could similarly have two WLs (e.g., WL1 and WL2) that do not store data (e.g., due to unreliability) and two WLs (e.g., WL3 and WL4) that only store 3 pages. Other embodiments may have other arrangements of active wordlines.

Effective programming times (EFF TPROG) for the wordlines are illustrated alongside the active wordlines, where the EFF TPROGs shown may represent the average time (the time per page) to program the pages for a group of memory cells (e.g., of a subblock) coupled to the wordline (e.g., for a group of cells in which 4 pages are programmed, the EFF TPROG may be the total time to program the TP, XP, UP, and LP divided by 4). As seen in FIG. 5, the WLs (e.g., 34-40) located in the middle of the deck have a faster EFF TPROG (e.g., 1500 uS) than the WLs (e.g., WL 46-48) located near the end of the deck (e.g., 2400 uS). Although only one end of the lower deck is depicted, the other end of the deck (e.g., the wordlines near WL0) may similarly have slower EFF TPROGs. For example, WLs near both the ends of the deck may have a larger interference coefficient (e.g., FGFG) and higher degradation under temperature changes due to larger variation in channel and cell uniformity. In order to maintain the same data reliability on these WLs, the programming operation may be slowed down by attempting to achieve finer placement of the Vts during the programming operation (effectively reducing the width of the programmed Vt distributions). Accordingly, these WLs may have a slower EFF TPROG.

In various embodiments of the present disclosure, one or more pre-determined pages of one or more WLs may be skipped during sequential write operations on the storage device 106. For this particular example of QLC 3D NAND, the XP and TP pages on WL46 (e.g., pages 2848 and 2849) on SB0 are skipped, such that only the LP and UP pages (e.g., pages 2722 and 2723) are programmed on WL46 on SB0. This results in a faster programming of WL46 as the programmed Vt distributions may be wider (and/or fewer programming passes may be used to program the WL). Thus, the EFF TPROG of WL46 for SB0 is reduced relative to the EFF TPROG to program all four pages and accordingly the write uniformity is improved (as the faster TPROG for WL46 may balance out the slower TPROG for the adjacent WLs).

In various embodiments, the same pages for the wordline on each subblock may be skipped (e.g., if the TPROGs for the wordlines of the various SBs are generally consistent across the SBs). For example, the programming of the same pages (the XP and TP pages) on WL 46 on SB1, SB2, and so on may be skipped. In other embodiments, different respective pages of the SBs may be skipped (e.g., if these different pages would result in different improvements to the write uniformities for the SBs).

In some pages, responsive to a sequential write operation, one or more pages on more than one wordline may be skipped. For example, in some embodiments one or more pages on a wordline of one side of the deck or block may be skipped and one or more pages on a wordline on the other side of the deck or block may be skipped. In other embodiments, one or more pages from any suitable wordlines placed anywhere in a block may be skipped. Although the embodiment depicted shows the skipping of two pages per a particular wordline per subblock, in other embodiments, one or more pages may be skipped (e.g., only the TP; the TP and XP; the TP, XP, and UP; etc.) for the wordline or a portion thereof (e.g., only for particular subblocks), or the programming of a wordline (that would be programmed during a random write operation) may be skipped altogether.

The pages that are skipped could be, but are not required to be, the pages of a WL with the highest TPROG in a deck. For example, in some embodiments, the first and last active WLs may have the highest TPROG, but the write uniformity may be improved more by skipping one or more pages on a different WL (e.g., because the write uniformity is a rolling average of the programming time across multiple wordlines). Accordingly, in the embodiment depicted, pages of WL46 are skipped rather than pages of WL48.

The choice of pages to be skipped may depend, for example, on the particular memory (e.g., NAND) technology, TPROG profile by WL, and the throughput vs. time plot for a particular memory array. In various embodiments, the particular pages to be skipped may be determined (e.g., via testing at the time of manufacture) and logic (e.g., firmware) of the storage device (e.g., storage device controller 118, controller 126, or other control logic) may be programmed accordingly.

In various embodiments, the feature of skipping one or more pages may be enabled during sequential write sequences on the storage device 106, but not during random write operations. For example, a page that was skipped during a sequential write sequence may later be written to by a random write operation (e.g., after the corresponding block has been erased prior to the random write operation).

The control logic (e.g., storage device controller 118, controller 126) may be configured to avoid unintended trigger rate and endurance downsides. For example, the storage device controller 118 may detect a sequential write sequence in the command queue. In order to do this, the controller 118 may track the sequence of logical byte addresses of the input data. When a new block is opened for writing (e.g., when a block is erased), the controller 118 may determine whether the logical byte addresses indicate that a sequential write operation is being performed. For example, the controller 118 may determine that a plurality of write commands (e.g., over a threshold number of write commands) specify consecutive logical addresses. As another example, the controller 118 may determine that a plurality of write commands are in sequential order and span at least an entire block (or a threshold number of blocks). If the controller 118 determines that a sequential write sequence is being performed, it may enable the page skipping feature for this block on the memory device 122. For example, the controller 118 may skip programming of the pre-determined pages. When the page skipping feature is enabled for a block, the controller 118 may omit creation of a logical page-to-physical page mapping for the skipped page(s). The controller may also track which blocks in a memory device 122 have the page skipping feature enabled (which may inherently track which wordlines have pages that are skipped if the same wordlines have pages skipped in each block). Alternatively, the controller 118 may track the specific pages and/or wordlines that have been skipped. In some embodiments, enabling the page skipping feature for the block may include sending a message to a controller 126 indicating that the page skipping feature is enabled for this block (e.g., to allow the memory device 122 to apply offsets to read and/or program voltages as described below). The controller 118 may disable the page skipping feature after finishing the programming of the block on the memory device 122 (e.g., if the controller 118 has already communicated the page skipping feature for the block to the controller 126 or if the block is being erased).

When one or more pages on a WL are skipped, read offsets may be used to more accurately perform the reading of pages that are on the WLs adjacent to the WL with the pages that were skipped or to perform the reading of one or more pages on the WL itself. For example, neighbor Vt aggression induced interference on some pages programmed prior to and after the skipped pages may shift the Vt distributions of the programmed pages. Thus, if one or more pages are skipped on a particular WL, the neighbor WLs may be programmed to different levels than other WLs which have neighbor WLs which were fully programmed. Accordingly, when one of these neighbor WLs is read, a read offset may be applied to compensate for the skipped pages.

Furthermore, because the WL that has one or more pages skipped is not fully programmed, the read operation for the one or more pages that were programmed for the WL may be performed using different read levels. For example, skipping the reading of the XP and TP pages on a WL when reading the LP and UP pages on that WL may require specific read offsets to be applied by a memory device 122. Thus, when a WL is read in which one or more pages were skipped during programming, a read offset may be applied.

Accordingly, the controller 118 may communicate that a read offset should be applied when a read command is sent by the controller 118 to the controller 126 for a particular page of a WL for which an offset should be applied. This communication may be performed in any suitable manner. In one example, the controller 118 may send a notification to the controller 126 that the page skipping feature is enabled for a particular block and the controller 126 may then apply the offset(s). In such an example, the controller 126 may be pre-programmed with the offset(s) to apply for one or more wordlines of a block in which the page skipping feature is enabled. For example, firmware specifying the offset(s) may be loaded for the controller 126 or the controller 118 may have previously sent a message specifying the offsets to the controller 126. In another example, the controller 118 may explicitly communicate the offset(s) to be applied for one or more read operations (e.g., at the time the read operation is issued to the controller 126).

In some embodiments, controller 118 may also communicate (or controller 126 may be pre-programmed with) one or more voltage offsets to be utilized during a program operation (e.g., a program verify operation or for the actual programming of the cells) for pages of the WLs adjacent to a WL having skipped pages to account for the skipped pages in order to prevent erroneous bit error rate detections. In various embodiments, controller 118 may alternatively or additionally communicate (or controller 126 may be pre-programmed with) one or more voltage offsets to be utilized during a preread operation for pages of the WLs adjacent to a WL having skipped pages to account for the skipped pages in order to avoid misplacement issues. For example, when upper pages (e.g., the TP and XP) of a wordline are programmed, the lower pages (e.g., the LP and UP) may be read out first in order to determine what level to program the memory cells to and the one or more voltage offsets may be applied to account for differences in the preread values due to one or more pages being skipped.

The controller 126 may also support the feature of skipping one or more pages when programming a block during a sequential write sequence. In various embodiments, the controller 126 may apply appropriate Vt compensation during program verify, pre-read, other program operations, or read operations to the appropriate pages (e.g., as explained above) to avoid higher bit error rate or misplacement issues. The controller 126 may also prevent impact to endurance and reliability by skipping these pre-determined list of pages.

As used herein, controller may refer to any suitable control logic such as at least a portion of storage device controller 118, at least a portion of one or more memory device controllers 126, and/or other control logic of the storage device 106 or a memory device 122. Accordingly, functions described above as being performed by storage device controller 118 may be performed by a memory device controller 126 as appropriate, and vice versa.

Figure 6:
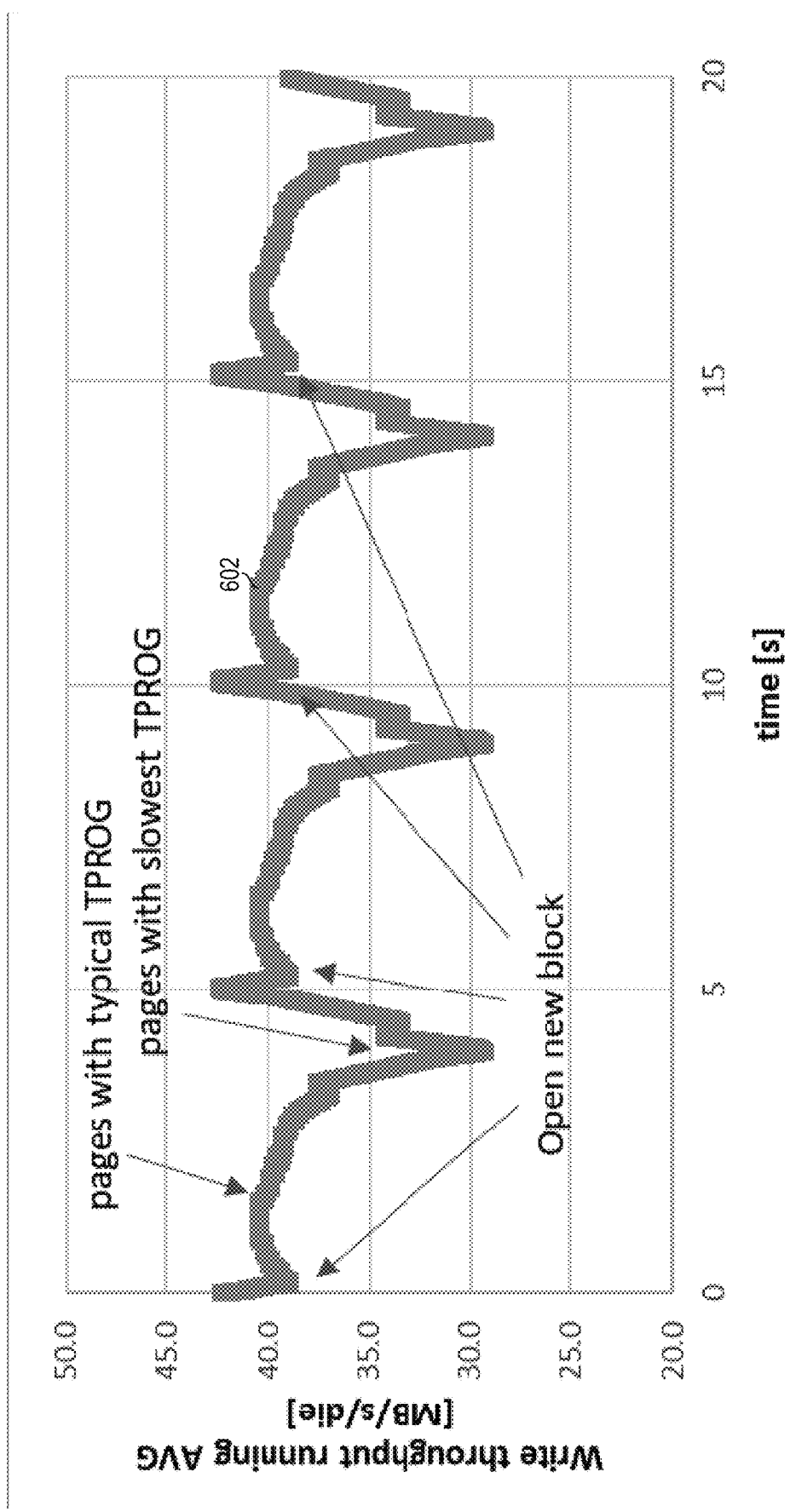
FIG. 6 illustrates a write throughput running average of memory pages without page skipping in accordance with certain embodiments.

FIG. 6 illustrates a write throughput running average graph 602 without page skipping in accordance with certain embodiments. FIG. 6 depicts the write throughput running average as a function of time during sequentially programming of a QLC 3D NAND. For example, the graph may correspond to the memory represented by the pagemap of FIG. 5 or other suitable memory. As depicted the average and minimum throughput are 38.2 MB/s and 29.3 MB/s respectively, which results in an overall write uniformity of ~77%. In this example, the uniformity gradually reduces and reaches a minimum at time=~4 s when the end of the block pages are programmed.

Figure 7:
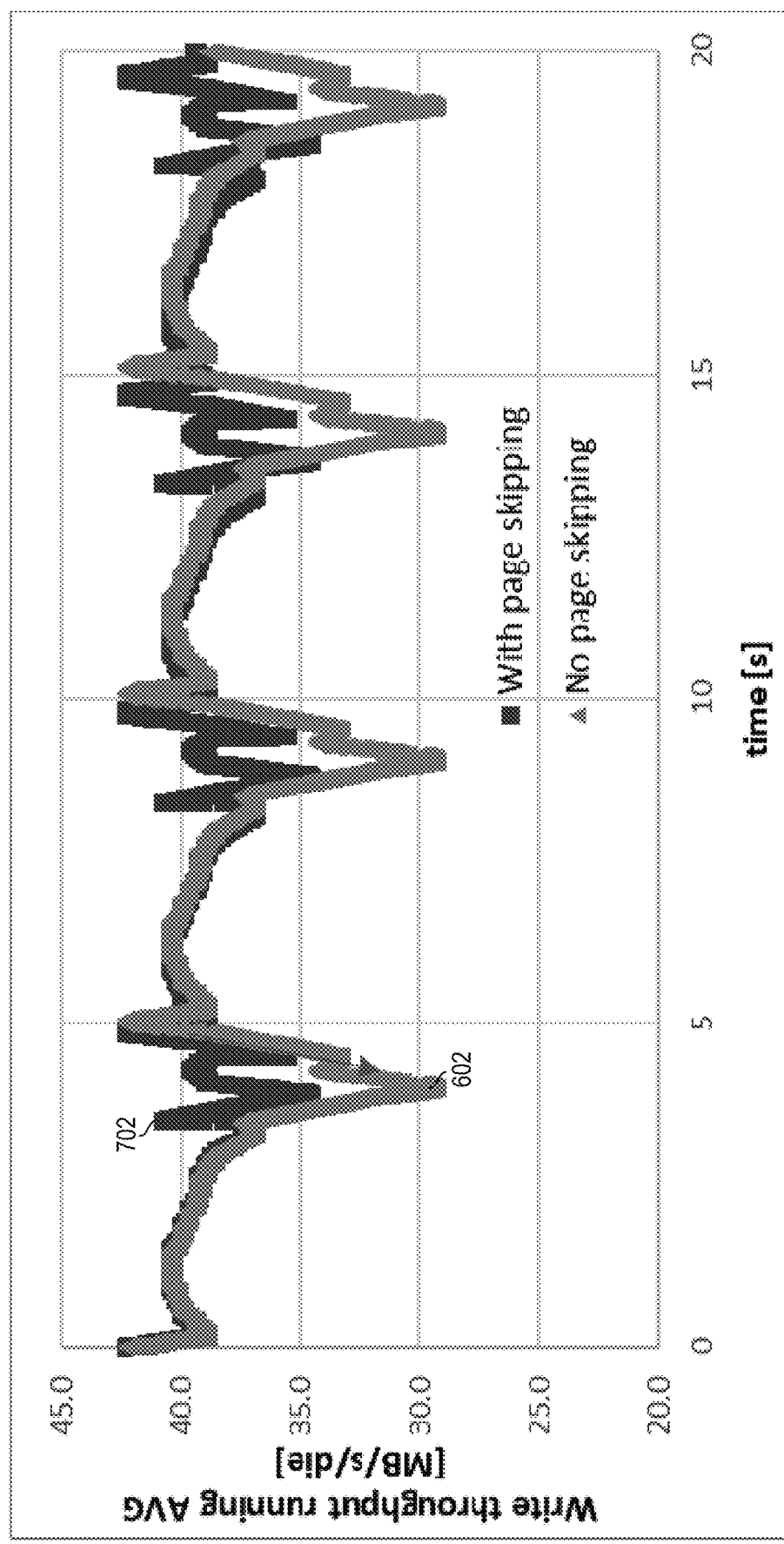
FIG. 7 illustrates write throughput running averages of memory pages with and without page skipping in accordance with certain embodiments.

FIG. 7 illustrates write throughput running averages with and without page skipping in accordance with certain embodiments. FIG. 7 repeats the plot of the write throughput running average graph 602 as a function of time, but also includes a write throughput running average graph 702 depicting the throughput when the page skipping scenario discussed in the text above is utilized. In this example, the minimum throughput improves to 34.5 MB/s as a result of skipping the XP and TP pages on WL46. In this example, the write uniformity improves to ~88%. Skipping 2 pages on 1 WL (out of 48 WLs) per deck results in a density loss of only ~1%. This loss in density is considerably smaller than the typical overprovisioning (e.g., 10-30%) in a storage device that may remain underutilized in a sequential write workload, and can therefore be absorbed without any impact on drive endurance.

Figure 8:
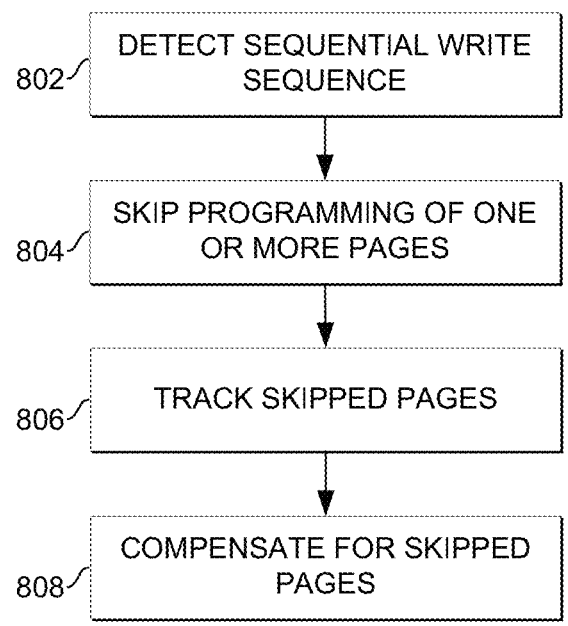
FIG. 8 illustrates a flow for improving write uniformity in accordance with certain embodiments.

FIG. 8 illustrates a flow for improving write uniformity in accordance with certain embodiments. The flow may be performed by any suitable logic, such as logic of storage device 106. At 802, a sequential write sequence is detected. At 804, programming of one or more pages is skipped responsive to the detection of the sequential write sequence. At 806, the skipped pages are tracked. At 808, compensation is applied for the skipped pages. The compensation may include any of the compensation techniques described above (such as adjusting one or more read voltages, program verify voltages, preread voltages, etc.).

Although various embodiments have been described with respect to particular encoding schemes (e.g., MLC, TLC, QLC), the teachings of such embodiments may be equally applicable to memories using any suitable encoding levels, including encoding schemes that become feasible in the future. Moreover, although the techniques have been described with respect to NAND memory, the techniques may be applied to any suitable memory types.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the manufacture of the described hardware.

In any representation of the design, the data representing the design may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components such as CPU 102, external I/O controller 104, processor 108, cores 114A and 114B, I/O controller 110, CPU memory controller 112, storage device 106, system memory device 107, memory 116, memory devices 122, memory chips 123, controllers 126, storage device controller 118, address translation engine 120, program control logic 124, memory array 200, subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, e.g., reset, while an updated value potentially includes a low logical value, e.g., set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Example 1 includes an apparatus comprising a memory comprising a group of memory cells coupled to a wordline; and a controller configured to skip programming of one or more pages of the group of memory cells responsive to a sequential write operation; and program the one or more pages of the group of memory cells responsive to one or more write commands.

Example 2 includes the subject matter of Example 1, wherein a write uniformity of the sequential write operation is improved by the skipping of the programming of the one or more pages of the group of memory cells responsive to the sequential write operation.

Example 3 includes the subject matter of any of Examples 1 and 2, and wherein the one or more pages that are skipped comprise a top page (TP) and an extra page (XP).

Example 4 includes the subject matter of any of Examples 1-3, and wherein the controller is further to program one or more pages of the group of memory cells responsive to the sequential write operation.

Example 5 includes the subject matter of any of Examples 1-4, and wherein the one or more pages of the group of memory cells that are programmed comprise a lower page (LP) and an upper page (UP).

Example 6 includes the subject matter of any of Examples 1-5, the controller to apply an offset for a read operation responsive to a determination that the programming of the one or more pages was skipped.

Example 7 includes the subject matter of any of Examples 1-6, the controller to apply an offset for a program verify operation responsive to a determination that the programming of the one or more pages was skipped Example 8 includes the subject matter of any of Examples 1-7, the controller to skip programming of the one or more pages of a second group of memory cells coupled to the wordline responsive to the sequential write operation, wherein the group of memory cells are part of a first subblock of the memory and the second group of memory cells are part of a second subblock of the memory.

Example 9 includes the subject matter of any of Examples 1-8, the controller to skip programming of one or more pages of a second group of memory cells coupled to a second wordline responsive to the sequential write operation, wherein the write uniformity of the sequential write operation is further improved by the skipping of the programming of the one or more pages of the second group of memory cells.

Example 10 includes the subject matter of any of Examples 1-9, and wherein the apparatus comprises a solid state drive.

Example 11 includes the subject matter of any of Examples 1-10, and wherein the apparatus comprises a dual in-line memory module.

Example 12 includes a method comprising detecting a sequential write operation; skipping programming of one or more pages of a group of memory cells coupled to a wordline responsive to the detection of the sequential write operation; and programming the one or more pages of the group of memory cells responsive to the sequential write operation.

Example 13 includes the subject matter of Example 12, wherein a write uniformity of the sequential write operation is improved by the skipping of the programming of the one or more pages of the group of memory cells responsive to the sequential write operation.

Example 14 includes the subject matter of any of Examples 12-13, and wherein the one or more pages that are skipped comprise a top page (TP) and an extra page (XP).

Example 15 includes the subject matter of any of Examples 12-14, and further including programming one or more pages of the group of memory cells responsive to the sequential write operation.

Example 16 includes the subject matter of any of Examples 12-15, and wherein the one or more pages of the group of memory cells that are programmed comprise a lower page (LP) and an upper page (UP).

Example 17 includes the subject matter of any of Examples 12-16, and further including applying an offset for a read operation responsive to a determination that the programming of the one or more pages was skipped.

Example 18 includes the subject matter of any of Examples 12-17, further comprising applying an offset for a program verify operation responsive to a determination that the programming of the one or more pages was skipped Example 19 includes the subject matter of any of Examples 12-18, and further including skipping programming of the one or more pages of a second group of memory cells coupled to the wordline responsive to the sequential write operation, wherein the group of memory cells are part of a first subblock of the memory and the second group of memory cells are part of a second subblock of the memory.

Example 20 includes the subject matter of any of Examples 12-19, and further including skipping programming of one or more pages of a second group of memory cells coupled to a second wordline responsive to the sequential write operation, wherein the write uniformity of the sequential write operation is further improved by the skipping of the programming of the one or more pages of the second group of memory cells.

Example 21 includes a system comprising at least one memory chip comprising a group of memory cells coupled to a wordline; and a storage device controller coupled to the at least one memory chip, the storage device controller to detect a sequential write operation; skip programming of one or more pages of the group of memory cells responsive to the detection of the sequential write operation; and request programming of the one or more pages of the group of memory cells responsive to one or more random write commands.

Example 22 includes the subject matter of Example 21, and further including a processor to execute an instruction requesting the sequential write operation and to send one or more requests for the sequential write operation to the storage device controller.

Example 23 includes the subject matter of any of Examples 21 and 22, and further including one or more of a battery communicatively coupled to the processor, a display communicatively coupled to the processor, or a network interface communicatively coupled to the processor.

Example 24 includes the subject matter of any of Examples 21-23, wherein a write uniformity of the sequential write operation is improved by the skipping of the programming of the one or more pages of the group of memory cells responsive to the sequential write operation.

Example 25 includes the subject matter of any of Examples 21-24, and wherein the one or more pages that are skipped comprise a top page (TP) and an extra page (XP).

Example 26 includes the subject matter of any of Examples 21-25, and wherein the storage device controller is further to request programming of one or more pages of the group of memory cells responsive to the sequential write operation.

Example 27 includes the subject matter of any of Examples 21-26, and wherein the one or more pages of the group of memory cells that are programmed comprise a lower page (LP) and an upper page (UP).

Example 28 includes the subject matter of any of Examples 21-27, the storage device controller to specify an offset for a read operation responsive to a determination that the programming of the one or more pages was skipped.

Example 29 includes the subject matter of any of Examples 21-28, the storage device controller to specify an offset for a program verify operation responsive to a determination that the programming of the one or more pages was skipped Example 30 includes the subject matter of any of Examples 21-29, the storage device controller to skip programming of the one or more pages of a second group of memory cells coupled to the wordline responsive to the sequential write operation, wherein the group of memory cells are part of a first subblock of the memory and the second group of memory cells are part of a second subblock of the memory.

Example 31 includes the subject matter of any of Examples 21-30, the storage device controller to skip programming of one or more pages of a second group of memory cells coupled to a second wordline responsive to the sequential write operation, wherein the write uniformity of the sequential write operation is further improved by the skipping of the programming of the one or more pages of the second group of memory cells.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a memory comprising a group of memory cells coupled to a wordline; and
a controller configured to:
program one or more lower pages of the group of memory cells responsive to a sequential write operation;
skip programming of one or more upper pages of the group of memory cells responsive to the sequential write operation; and
program the one or more upper pages of the group of memory cells responsive to one or more random write commands.

2. The apparatus of claim 1, wherein a write uniformity of the sequential write operation is improved by the skipping of the programming of the one or more upper pages of the group of memory cells responsive to the sequential write operation.

3. The apparatus of claim 2, the controller to skip programming of one or more pages of a second group of memory cells coupled to a second wordline responsive to the sequential write operation, wherein the write uniformity of the sequential write operation is further improved by the skipping of the programming of the one or more pages of the second group of memory cells.

4. The apparatus of claim 1, wherein the one or more upper pages that are skipped comprise a top page (TP) and an extra page (XP).

5. The apparatus of claim 1, wherein the controller is further to adjust one or more voltages to compensate for the skipped programming of the one or more upper pages.

6. The apparatus of claim 1, wherein the one or more lower pages of the group of memory cells that are programmed comprise a lower page (LP) and an upper page (UP).

7. The apparatus of claim 1, the controller to apply an offset for a read operation responsive to a determination that the programming of the one or more upper pages was skipped.

8. The apparatus of claim 1, the controller to apply an offset for a program verify operation responsive to a determination that the programming of the one or more upper pages was skipped.

9. The apparatus of claim 1, further comprising skipping programming of one or more upper pages of a second group of memory cells coupled to the wordline responsive to the sequential write operation, wherein the group of memory cells are part of a first subblock of the memory and the second group of memory cells are part of a second subblock of the memory.

10. The apparatus of claim 1, wherein the apparatus comprises a solid state drive.

11. The apparatus of claim 1, wherein the apparatus comprises a dual in-line memory module.

12. A method comprising:
detecting a sequential write operation;
skipping programming of one or more upper pages of a group of memory cells coupled to a wordline responsive to the detection of the sequential write operation;
programming one or more lower pages of the group of memory cells responsive to the detection of the sequential write operation; and
programming the one or more upper pages of the group of memory cells responsive to one or more random write commands.

13. The method of claim 12, wherein a write uniformity of the sequential write operation is improved by the skipping of the programming of the one or more upper pages of the group of memory cells responsive to the sequential write operation.

14. The method of claim 12, further comprising adjusting one or more voltages to compensate for the skipped programming of the one or more upper pages.

15. The method of claim 12, wherein the one or more upper pages that are skipped comprise a top page (TP) and an extra page (XP).

16. A system comprising:
at least one memory chip comprising a group of memory cells coupled to a wordline; and
a storage device controller coupled to the at least one memory chip, the storage device controller to:
detect a sequential write operation;
skip programming of one or more upper pages of the group of memory cells responsive to the detection of the sequential write operation;
program one or more lower pages of the group of memory cells responsive to the detection of the sequential write operation; and
program the one or more pages of the group of memory cells responsive to one or more random write commands.

17. The system of claim 16, further comprising a processor to execute an instruction requesting the sequential write operation and to send one or more requests for the sequential write operation to the storage device controller.

18. The system of claim 17, further comprising one or more of: a battery communicatively coupled to the processor, a display communicatively coupled to the processor, or a network interface communicatively coupled to the processor.

19. The system of claim 16, wherein a write uniformity of the sequential write operation is improved by the skipping of the programming of the one or more upper pages of the group of memory cells responsive to the detection of the sequential write operation.

20. The system of claim 16, wherein a programming time for an equivalent number of pages is longer for the group of memory cells coupled to the wordline than for a second group of memory cells coupled to a second wordline adjacent to the wordline the storage device controller to request the programming of one or more pages of the group of memory cells responsive to the sequential write operation.

* * * * *